United States Patent
Kim et al.

(10) Patent No.: US 8,652,296 B2
(45) Date of Patent: Feb. 18, 2014

(54) SIDE GAS INJECTOR FOR PLASMA REACTION CHAMBER

(75) Inventors: Minshik Kim, Suwon (KR); Sungyong Ko, Suwon (KR); Hwankook Chae, Suwon (KR); Kunjoo Park, Suwon (KR); Keehyun Kim, Suwon (KR); Weonmook Lee, Suwon (KR)

(73) Assignee: DMS Co., Ltd., Suwon (KR)

( * ) Notice: Subject to any disclaimer, the term of this patent is extended or adjusted under 35 U.S.C. 154(b) by 752 days.

(21) Appl. No.: 12/871,109

(22) Filed: Aug. 30, 2010

(65) Prior Publication Data

US 2011/0079356 A1    Apr. 7, 2011

(30) Foreign Application Priority Data

Oct. 1, 2009    (KR) .................... 10-2009-0093796

(51) Int. Cl.
*C23F 1/00* (2006.01)
*H01L 21/306* (2006.01)

(52) U.S. Cl.
USPC ................................. 156/345.34; 156/345.33

(58) Field of Classification Search
USPC ........................................ 156/345.33, 345.34
See application file for complete search history.

(56) References Cited

U.S. PATENT DOCUMENTS

| | | | | |
|---|---|---|---|---|
| 2004/0149701 | A1* | 8/2004 | Gonzalez et al. | 219/121.51 |
| 2007/0087296 | A1* | 4/2007 | Kim et al. | 431/181 |

FOREIGN PATENT DOCUMENTS

| | | | | |
|---|---|---|---|---|
| KR | 2004-0014760 | * | 2/2004 | .............. H01L 21/20 |
| KR | 1020060059305 | | 6/2006 | |
| KR | 1020080067061 | | 7/2008 | |

OTHER PUBLICATIONS

English translation KR 2004-0014760, Feb. 2004, Kwon.*
English translation, KR 2008-0067061, Jul. 2008, Jung.*

* cited by examiner

*Primary Examiner* — Keath Chen
(74) *Attorney, Agent, or Firm* — IPLA P.A.; James E. Bame (57) ABSTRACT

A side gas injector for a plasma reaction chamber is provided. The side gas injector includes a circular distribution plate and a cover plate. The circular distribution plate includes an injection hole for injecting a reaction gas and a distribution channel part for distributing the reaction gas such that the reaction gas introduced from the injection hole can be radially simultaneously jetted in a plurality of positions along an inner circumference surface of the distribution plate. The cover plate is coupled to a top of the distribution plate and seals a top of the distribution channel part.

9 Claims, 7 Drawing Sheets

SIDE GAS INJECTOR FOR PLASMA REACTION CHAMBER

CROSS REFERENCE

This application claims foreign priority under Paris Convention and 35 U.S.C. §119 to Korean Patent Application No. 10-2009-0093796, filed Oct. 1, 2009 with the Korean Intellectual Property Office.

BACKGROUND OF THE INVENTION

1. Technical Field

The present invention relates to a side gas injector installed in a plasma reaction chamber. More particularly, the present invention relates to a side gas injector for a plasma reaction chamber, for radially uniformly jetting a reaction gas in the lateral direction of a wafer, thereby uniformly diffusing the reaction gas to an edge part of the wafer and, through an independent mass flow control, improving an etching uniformity in the edge part of the wafer.

2. Description of the Related Art

Generally, a large size wafer used for a semiconductor integrated circuit device, a glass substrate being a key part used for a Liquid Crystal Display (LCD), etc. form an ultra-fine circuit or pattern on a surface in a desired form by forming several thin film layers on the surface and selectively removing only part of the thin film layers.

Fine circuit or pattern manufacturing is commonly carried out through many manufacturing processes such as a rinse process, a deposition process, a photolithography process, a plating process, an etching process, etc.

The above various treatment processes are carried out after the wafer or substrate is inputted to a chamber or reaction furnace capable of isolating the wafer or substrate from the external.

Among the above processes, particularly, the etching process is a process of removing desired materials from a wafer surface through a physical or chemical reaction of a plasma state by jetting a suitable reaction gas (e.g., carbon tetrafluoride ($CF_4$), chlorine gas ($Cl_2$), hydrogen bromide (HBr), oxygen ($O_2$), argon (Ar), etc.) into the chamber or reaction furnace. The etching process is a process of selectively removing a portion not covered with a photoresist using a photoresist pattern as a mask and forming a fine circuit on a surface.

In the etching process, it is of significance best of all to maintain an etching uniformity in the whole wafer surface. Therefore, by uniformly diffusing a reaction gas into the reaction chamber, the etching process secures plasma uniformity within the reaction chamber and improves the etching uniformity, thus realizing the prevention of a process error.

For the sake of the uniform diffusion of the reaction gas within the reaction chamber, the conventional art sought to secure an etching uniformity in a center part and edge part of a wafer by installing a jet nozzle at a top of the reaction chamber and making different a mass flow of gas jetted to each of an upper center and edge of the reaction chamber.

However, the above-described conventional gas injector has the following problems.

First, as a wafer is large scaled, a pattern density difference between the center part and edge part of the wafer increases. Thus, a difference of a consumption amount of a reaction gas causes the local exhaust of an etching source, so leading to the occurrence of a phenomenon in which a difference of an etching speed between the center part and edge part of the wafer.

Second, there is a problem in which a by-product caused by fluoromethane ($CHF_3$), methylene fluoride ($CH_2F_2$), etc. used for an increase of selectivity is decomposed in the wafer edge and performs a passivation action of suppressing etching, thus greatly reducing an etch rate of the edge part or decreasing an etching width (i.e., a Critical Dimension (CD)).

Third, in case that a reaction gas is jet with its different mass flow in the direction from the top of the reaction chamber to the wafer edge, a degree of diffusion of the reaction gas varies depending on process condition while the reaction gas reaches the edge part of the wafer. This leads to making it difficult to independently control a distribution of the reaction gas in the edge part of the wafer, thus not being able to secure an etching uniformity in the edge part of the wafer.

SUMMARY OF THE INVENTION

An aspect of exemplary embodiments of the present invention is to address at least the problems and/or disadvantages and to provide at least the advantages described below. Accordingly, an aspect of exemplary embodiments of the present invention is to radially uniformly jet a reaction gas at the side of a large size wafer, thereby preventing an etching speed difference and an etching non-uniformity from occurring in a center part and edge part of the large size wafer because of the exhaust of an etching source in the edge part of the large size wafer.

Another aspect of exemplary embodiments of the present invention is to make it possible to independently control a gas density in an edge part of a wafer independent of a center part of the wafer, thus effectively controlling a difference of an etch rate or a Critical Dimension (CD) between the center part and edge part of the wafer.

Another aspect of exemplary embodiments of the present invention is to reduce a process time and secure an etching uniformity in the whole wafer surface through a quick and uniform diffusion of a reaction gas, thereby greatly improving a chip throughput in an edge part of a wafer.

According to one aspect of the present invention, a side gas injector for a plasma reaction chamber is provided. The side gas injector includes a circular distribution plate and a cover plate. The circular distribution plate includes an injection hole for injecting a reaction gas and a distribution channel part for distributing the reaction gas such that the reaction gas introduced from the injection hole can be radially simultaneously jetted in a plurality of positions along an inner circumference surface of the distribution plate. The cover plate is coupled to a top of the distribution plate and seals a top of the distribution channel part.

The distribution channel part includes inlet ports which the reaction gas enters, a plurality of jet ports arranged at equal intervals along the inner circumference surface of the distribution plate, and a branch channel having flow paths sequentially branched such that the reaction gas introduced into the inlet port is uniformly distributed to each of the plurality of jet ports.

A plurality of the inlet ports are spaced apart and arranged along an outer circumference of the branch channel.

In the branch channel, the flow paths form a plurality of circular patterns forming a concentric circle on the basis of the center of the distribution plate, and a plurality of communication paths are spaced apart and installed such that the flow paths communicate with each other.

The branch channel is comprised of a plurality of circular arc shaped channel segments. The channel segments are radially spaced a predetermined distance apart and arranged in the circumference direction and the radial direction such that the flow paths and the communication paths are formed.

The channel segments form the communication paths such that the reaction gas is movable in zigzags.

A circular diffusion channel communicating with the injection hole is provided in an outer circumference of the branch channel such that the reaction gas is uniformly distributed to the plurality of inlet ports.

The diffusion channel is provided in a relatively larger width than the flow paths of the branch channel.

In the diffusion channel, a diffusion prevention jaw is provided such that a circular first diffusion path communicating with the injection hole and a second diffusion path are isolated and formed, and an inlet hole and an outlet hole communicating with each other are provided in bottom surfaces of the first and second diffusion paths, respectively.

The inlet hole and the outlet hole face each other with interposing the diffusion prevention jaw therebetween.

The inlet hole and the outlet hole communicate with each other through a connection path through-formed below the diffusion prevention jaw. The connection path is connection formed such that slanting paths symmetrically face each other.

A plurality of the inlet holes and outlet holes are arranged at equal intervals along the first and second diffusion paths, respectively.

The injection hole is provided in plural.

BRIEF DESCRIPTION OF THE DRAWINGS

The above and other objects, features and advantages of the present invention will become more apparent from the following detailed description when taken in conjunction with the accompanying drawings in which.

Throughout the drawings, the same drawing reference numerals will be understood to refer to the same elements, features and structures.

DESCRIPTION OF SPECIFIC EMBODIMENTS

Exemplary embodiments of the present invention will now be described in detail with reference to the annexed drawings. In the following description, a detailed description of known functions and configurations incorporated herein has been omitted for conciseness.

A description of the present invention is made below in detail with reference to the accompanying drawings.

Figure 1:
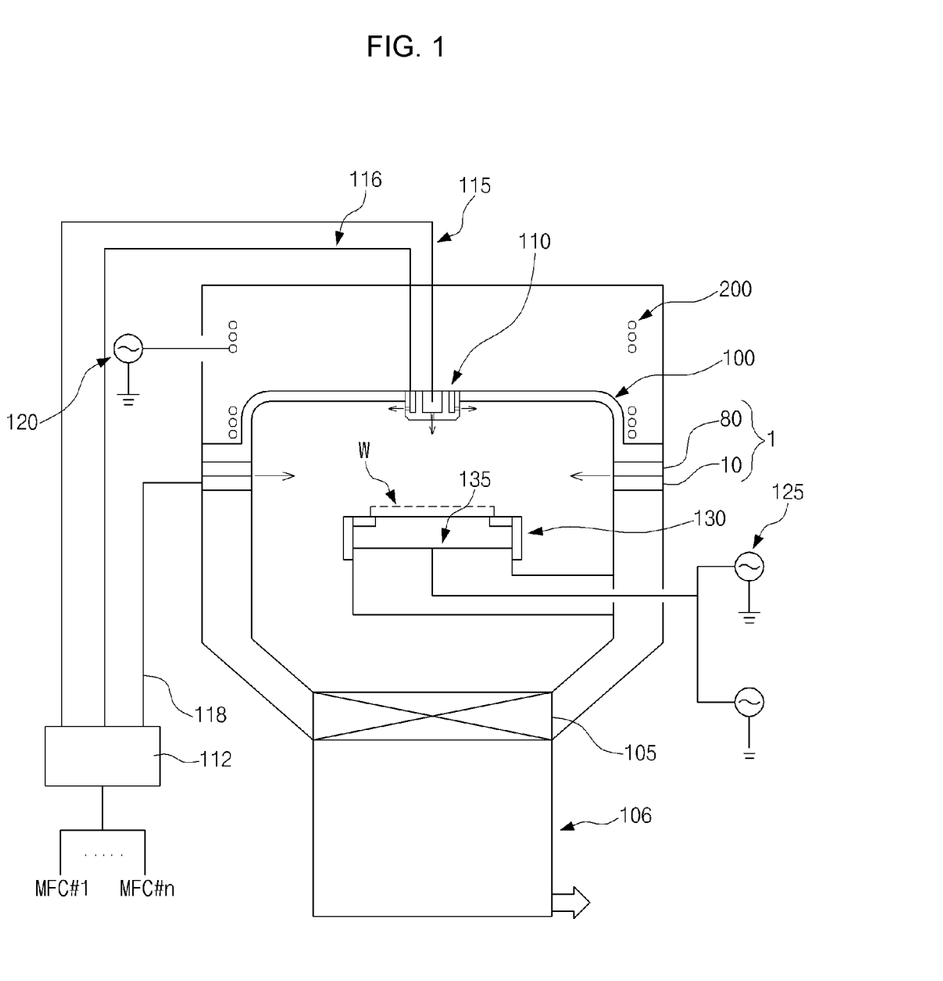
FIG. 1 is a diagram illustrating a construction of a plasma etching apparatus in which a side gas injector according to the present invention is installed.

FIG. 1 is a diagram illustrating a construction of a plasma etching apparatus in which a side gas injector of the present invention is installed.

As illustrated, the plasma etching apparatus includes a chamber 100, a cathode assembly 130, a gas injector 110, Radio Frequency (RF) powers 120 and 125, and a gas mass flow control module 112.

The chamber 100 provides a plasma reaction space isolated from the external. The gas injector 110 jetting a reaction gas is installed at an upper center of the chamber 100. An exhaust port 105 exhausting out a reaction by-product such as a reaction gas, polymer, particles, etc. is installed at a lower center of the chamber 100.

The cathode assembly 130 includes a stage 135, and can be installed to protrude from the side of the chamber 100. The stage 135 connects with the RF power 125 to form an electrode and simultaneously, supports a wafer (W) such that the wafer (W) can be loaded in a horizontal state at the center of the inside of the chamber 100.

The cathode assembly 130 can include an Electrostatic Chuck (ESC) to stably fix the wafer (W). For the sake of cooling the wafer (W), a gas pipe (not shown) for circulating a helium (He) gas, etc. or a cooling water pipe (not shown) for circulating a refrigerant can be installed in the cathode assembly 130.

The gas injector 110 is installed at an upper center of the chamber 100 and jets a reaction gas to the inside of the chamber 100. The gas injector 110 is provided to jet a reaction gas in a central direction and a lateral direction as indicated by arrows, respectively, for the sake of diffusing the reaction gas and thus securing plasma uniformity.

Here, the gas injector 110 receives a reaction gas of a suitable mass flow from the gas mass flow control module 112 through gas supply pipes 115 and 116 and jets the received reaction gas.

The RF powers 120 and 125 connect to a source coil 200 of a top of the chamber 100 and the cathode assembly 130, respectively. The RF powers 120 and 125 electrically discharge a reaction gas jetted into the chamber 100 and convert the reaction gas into a plasma state, thereby etching a surface of the wafer (W) by plasma.

As illustrated in FIG. 1, a side gas injector 1 includes a distribution plate 10 and a cover plate 80. The side gas injector 1 is installed along a side wall of the chamber 100 such that a reaction gas can be jetted at the side of the wafer (W). The side gas injector 1 receives a reaction gas of a suitable mass flow from the gas mass flow control module 112 through a gas supply pipe 118 and jets the reaction gas in the lateral direction of the wafer (W).

Accordingly, if a reaction gas is jetted from the gas injector 110 and the side gas injector 1 to the inside of the chamber 100, the plasma etching apparatus enables a pressure control unit (not shown) to control an internal pressure of the chamber 100, applies the RF powers 120 and 125 to convert the reaction gas into a plasma state, and allows this plasma to contact and react with a surface of the wafer (W), thereby etching the surface of the wafer (W) in a predetermined pattern.

At this time, the reaction gas and reaction by-products are forcibly exhausted out through the exhaust port 105.

The side gas injector 1 controls a mass flow of the reaction gas jetted in the lateral direction of the wafer (W), thereby leading uniform plasma formation at an edge part of the wafer (W).

Figure 3:
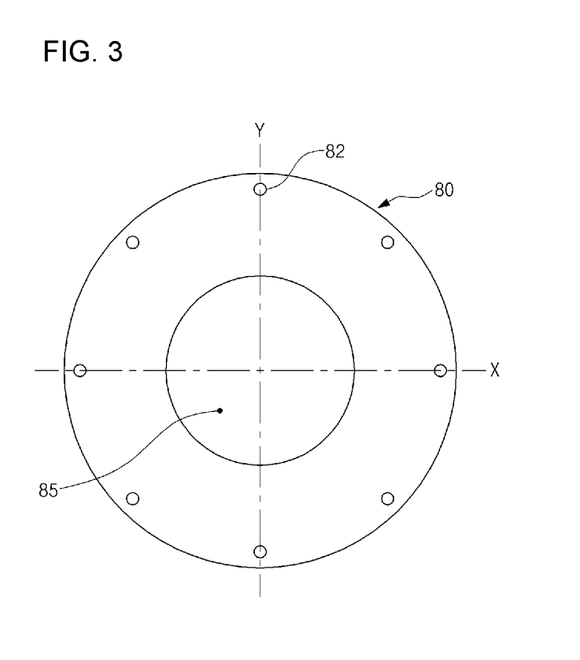
FIG. 3 is a plane diagram illustrating a cover plate of a side gas injector according to the present invention.
Figure 4:
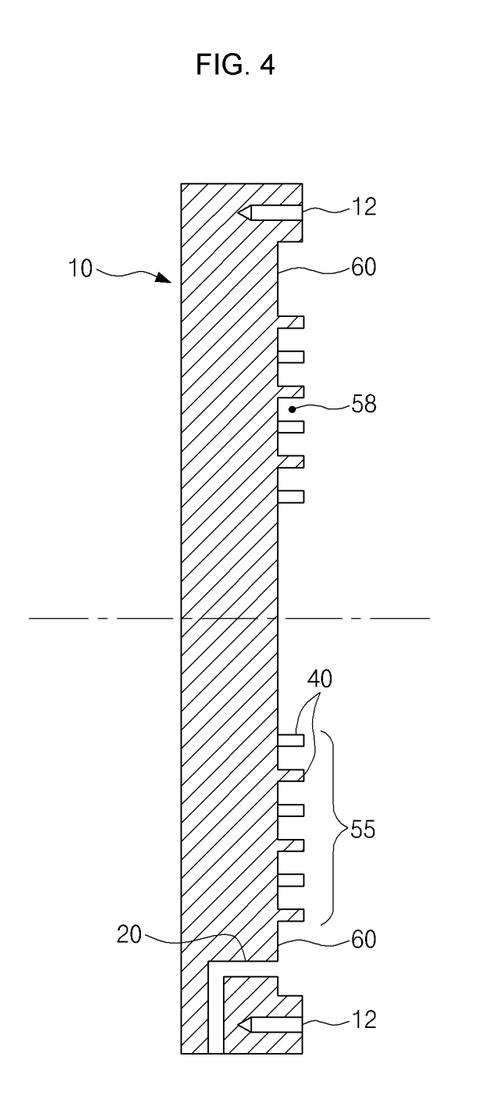
FIG. 4 is a cross section taken along line A-A of FIG. 2.

The side gas injector 1 for the plasma reaction chamber according to the exemplary embodiment of the present invention is described below in detail with reference to FIGS. 2 to 4.

Figure 2:
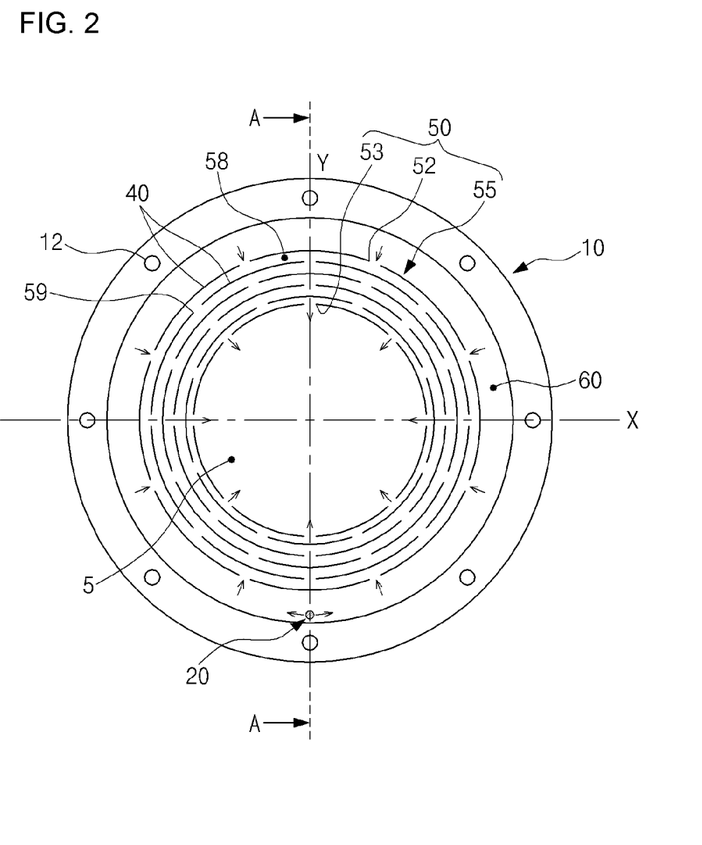
FIG. 2 is a plane diagram illustrating a distribution plate of a side gas injector according to the present invention.

FIG. 2 is a plane diagram illustrating a distribution plate 10 of the side gas injector 1. FIG. 3 is a plane diagram illustrating a cover plate 80. FIG. 4 is a cross section taken along line A-A of FIG. 2.

The side gas injector 1 of the present invention includes the distribution plate 10 and the cover plate 80.

The distribution plate 10 is provided in a ring shape having a through-hole 5 at a center such that the distribution plate 10 can be installed at a side wall of the chamber 100. The distribution plate 10 includes an injection hole 20 and a distribution channel part 50.

The distribution channel part 50 includes an inlet port 52, a jet port 53, and a branch channel 55.

The distribution plate 10 can be provided in various shapes such as a circular shape, a rectangular shape, etc. correspondingly to a structure of the chamber 100. The distribution plate 10 has connection holes 12 provided in its upper surface at equal intervals along a circumference such that the distribution plate 10 can be coupled to the cover plate 80 to be described later.

The injection holes 20 are to inject a reaction gas to the distribution channel part 50. As illustrated in FIG. 4, the injection hole 20 is through-formed such that the injection hole 20 is exposed at one end to a bottom surface of a diffusion channel 60 surrounding an outer circumference of the distribution channel part 50 and is exposed at the other end to the side of the distribution plate 10, thus communicating with the external.

The other end of the injection hole 20 exposed to the side of the distribution plate 10 is, as illustrated in FIG. 1, connected with the gas mass flow control module 112 through the gas supply pipe 118.

The diffusion channel 60 diffuses a reaction gas injected through the injection holes 20 such that the reaction gas is uniformly distributed in a plurality of inlet ports 52 formed in the distribution channel part 50.

Thus, after the reaction gas is injected into the diffusion channel 60 through the injection holes 20, the reaction gas is diffused along the diffusion channel 60 and then, is introduced through the inlet port 52 of the distribution channel part 50.

The inlet ports 52 and the jet ports 53 are formed in plural at equal intervals in an outer circumference and inner circumference of the branch channel 55, respectively.

The branch channel 55 distributes a reaction gas introduced through the inlet ports 52 to the jet ports 53, respectively, and simultaneously, causes a constant flow resistance against a flow of the reaction gas to sufficiently diffuse the reaction gas through a plurality of sequentially repeatedly branched flow paths 58, thereby jetting a uniform mass flow into the chamber 100 through the respective jet ports 53.

The flow paths 58 form a plurality of circular patterns forming a concentric circle on the basis of the center of the distribution plate 10. Simultaneously, a plurality of communication paths 59 are installed at equal intervals to communicate the flow paths 58 with each other.

However, the flow paths 58 are not limited to the circular pattern, and may be formed in various shaped patterns applying a constant resistance against a flow of a reaction gas such that a uniform mass flow can be distributed to the respective jet ports 53.

The branch channel 55 includes a plurality of arc shaped channel segments 40 such that the flow paths 58 and the communication paths 59 are formed.

The channel segments 40 are of an arc shape having a constant height and a constant length, and are installed standing up at a constant interval on an upper surface of the distribution plate 10 such that the flow paths 58 are formed.

The channel segments 40 are arranged to be spaced a predetermined distance apart in circumference direction on the basis of the center of the distribution plate 10, and are sequentially installed standing up in plural to be spaced a predetermined distance apart even in radial direction.

Accordingly, the channel segments 40 radially form the plurality of inlet ports 52 and jet ports 53 in the outer circumference and inner circumference of the branch channel 55, and radially form the communication paths 59 for communicating the flow paths 58 with each other.

The channel segments 40 are arranged such that the communication path 59 is positioned correspondingly to a center part of a neighboring other channel segment 40. So, when a reaction gas moves from the inlet port 52 to the jet port 53, the reaction gas can be sequentially branched and moved along the flow path 58 in a zigzag form.

Desirably, the diffusion channel 60 is formed to have a relative larger width than the flow path 58 of the branch channel 55 such that a reaction gas is rapidly diffused and distributed to the plurality of inlet ports 52 of the branch channel 55.

The cover plate 80 is coupled to an upper surface of the distribution plate 10. Like the distribution plate 10, the cover plate 80 is provided in a circular shape having a through-hole 85 at its center. Connection holes 82 are through-formed along a circumference of the cover plate 80 correspondingly to the connection holes 12 of the distribution plate 10.

Here, the cover plate 80 is coupled and contacted by a fixing bolt to the upper surface of the distribution plate 10, thereby sealing the distribution channel part 50 and the diffusion channel 60 and forming the flow path 58.

At this time, a sealing member (e.g., an 'O'-ring) may be installed in a contact part between the cover plate 80 and the distribution plate 10 to prevent a leakage of a reaction gas.

Accordingly, after the reaction gas is introduced through the injection hole 20 and is diffused along the diffusion channel 60, the reaction gas enters the plurality of inlet ports 52 of the distribution channel part 50, passes through the flow paths 58 of the branch channel 55, and then is radially jetted into the chamber 100 through the jet ports 53.

While passing through the branch channel 55, the reaction gas suffers a flow resistance and in addition, because a time for the reaction gas to move from the inlet port 52 to the jet port 53 is relatively longer than a time for the reaction gas to diffuse along the diffusion channel 60, the reaction gas sufficiently diffuses in the branch channel 55 and then reaches the jet port 53. This leads a uniform mass flow to simultaneously continuously reach the edge part of the wafer (W) through the plurality of jet ports 53.

Also, the present invention installs the jet ports 53 adjacently to the edge part of the wafer (W), thereby minimizing the diffusion of the reaction gas until the reaction gas reaches the wafer (W), thus making it easy to independently control the reaction gas. Through this, the present invention can effectively control an amount of the reaction gas reaching the edge part of the wafer (W), thus improving etching non-uniformity or CD deviation between the center part and edge part of the wafer (W) or etch stop capable of occurring because a by-product generated in the center part of the wafer (W) is again decomposed and remained in the edge part in a polymer form.

A distribution plate according to another exemplary embodiment of the present invention is described below with reference to FIGS. 5 to 8.

Figure 5:
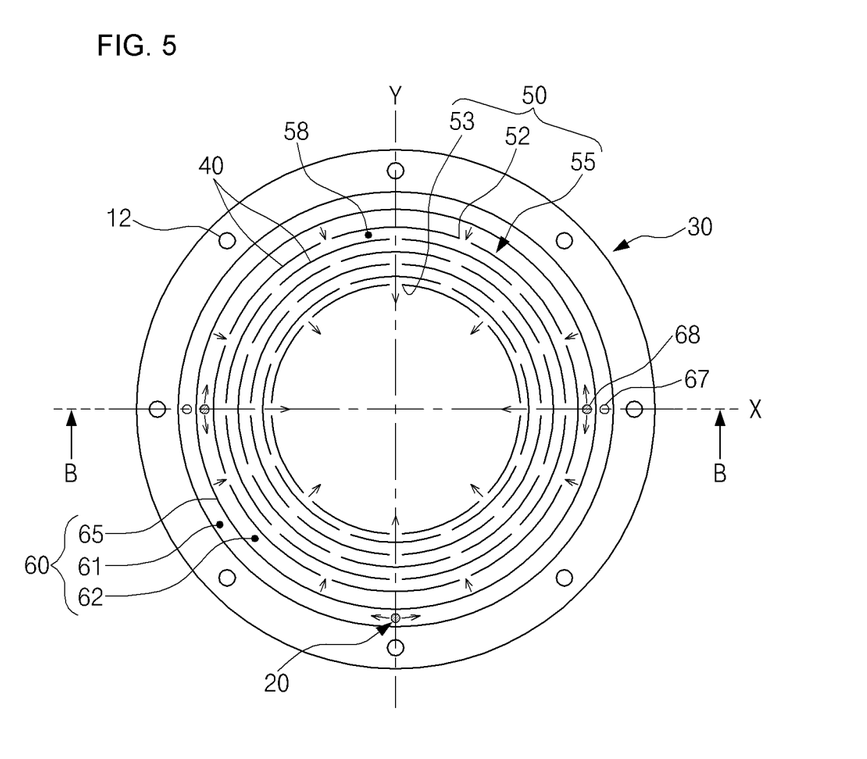
FIG. 5 is a plane diagram illustrating a distribution plate according to another exemplary embodiment of the present invention.
Figure 6:
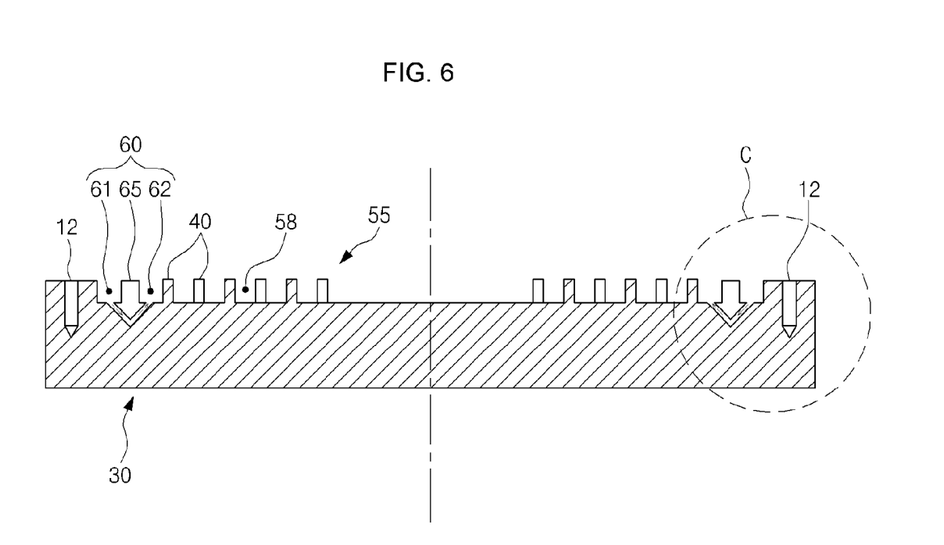
FIG. 6 is a cross section taken along line B-B of FIG. 5.
Figure 7:
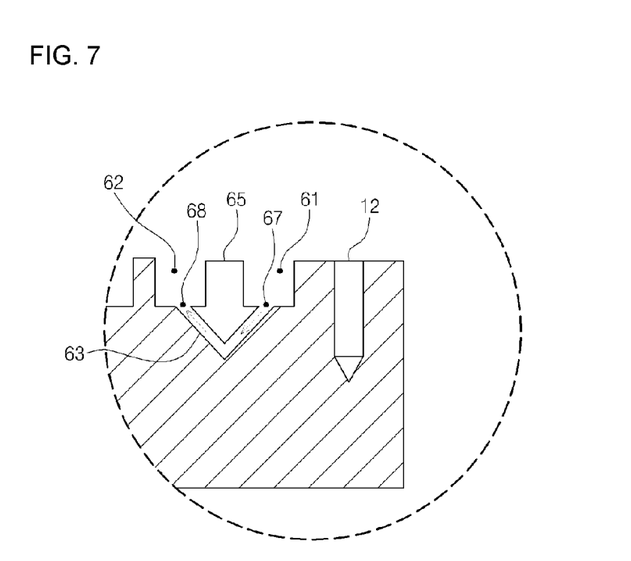
FIG. 7 is a partial exploded diagram of a portion "C" of FIG. 6.

FIG. 5 is a plane diagram illustrating the distribution plate. FIG. 6 is a cross section taken along line B-B of FIG. 5. FIG. 7 is a partial exploded diagram of a portion "C" of FIG. 6.

Except for a construction of a diffusion channel 60, exemplary embodiment of FIGS. 5 to 8 is identical with the aforementioned exemplary embodiment. Thus, only a modified construction is described below.

As illustrated in FIG. 5, a diffusion prevention jaw 65 is installed standing up along a center of the diffusion channel 60 formed in the distribution plate 30.

The diffusion prevention jaw 65 partitions the diffusion channel 60 into a first diffusion path 61 and a second diffusion path 62 to isolate the diffusion channel 60 as two regions.

An injection hole 20 and a plurality of inlet holes 67 are provided in a bottom surface of the first diffusion path 61. A plurality of outlet holes 68 are provided in the second diffusion path 62.

The inlet hole 67 and the outlet hole 68 can be installed on an 'X' axis to face each other with interposing the diffusion prevention jaw 65 therebetween. As illustrated in FIG. 7, the inlet hole 67 and the outlet hole 68 communicate with each other through a connection path 63 formed below the diffusion prevention jaw 65.

The connection path 63 can be formed by slanting surfaces symmetrically facing each other.

Thus, after a reaction gas is introduced into the first diffusion path 61 through the injection hole 20 and is diffused in both directions, the reaction gas simultaneously moves to the second diffusion path 62 via the two inlet holes 67, the connection path 63, and the outlet hole 68. Also, the reaction gas introduced into the second diffusion path 62 is again diffused in both directions along the second diffusion path 62 and enters each of inlet ports 52 of a branch channel 55.

Accordingly, after the reaction gas introduced from the injection hole 20 is sequentially diffused into the first and second diffusion paths 61 and 62 by the inlet hole 67 and the outlet hole 68, the reaction gas enters the inlet ports 52 of the branch channel 55. So, the reaction gas can be more effectively diffused due to an increase of a flow time and a flow resistance. Also, after the reaction gas is uniformly distributed and enters the respective inlet ports 52, the reaction gas is again sufficiently diffused due to a flow resistance while passing through flow paths 58 of the branch channel 55 and is uniformly jetted into a chamber through a plurality of jet ports 53.

Figure 8:
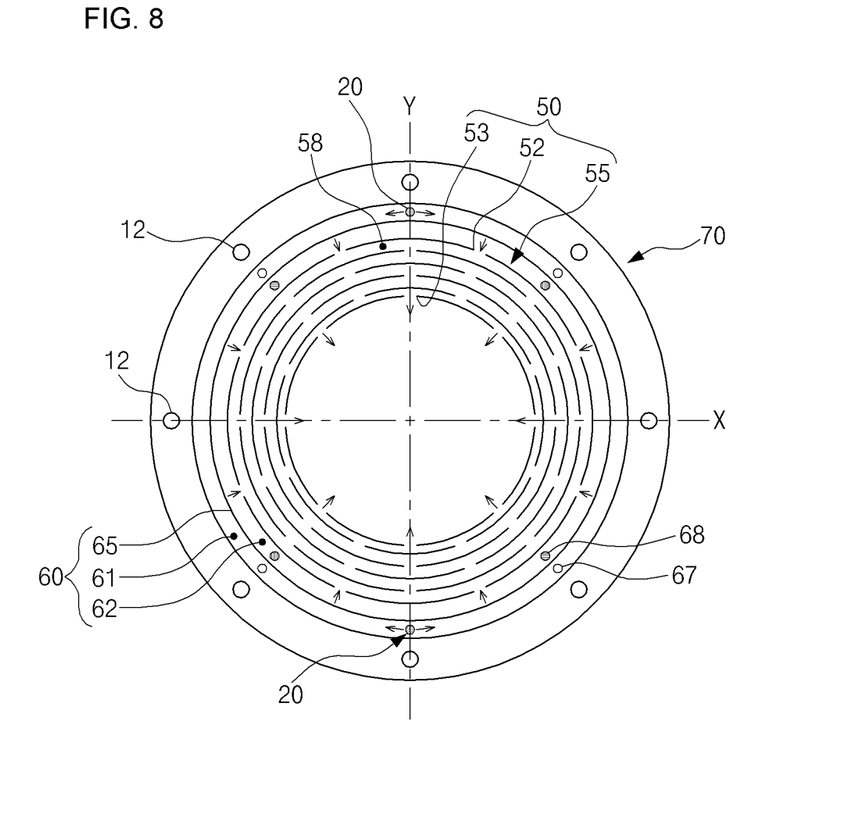
FIG. 8 is a plane diagram illustrating a distribution plate according to a further exemplary embodiment of the present invention.

FIG. 8 is a plane diagram illustrating a distribution plate 70 according to a further exemplary embodiment of the present invention.

As illustrated in FIG. 8, a first diffusion path 61 and a second diffusion path 62 are formed in a diffusion channel 60 of the distribution plate 70. Injection holes 20 are symmetrically provided in plural in the first diffusion path 61 to face each other on a 'Y' axis. An inlet hole 67 and an outlet hole 68 are each provided in the first diffusion path 61 and the second diffusion path 62 to face each other with interposing a diffusion prevention jaw 65 therebetween. The inlet hole 67 and the outlet hole 68 are arranged at equal intervals in plural along the first diffusion path 61 and the second diffusion path 62.

Accordingly, after the reaction gas is simultaneously introduced from the two injection holes 20 to the first diffusion path 61, the reaction gas is simultaneously discharged to the second diffusion path 62 through a plurality of the inlet holes 67 and outlet holes 68, thereby allowing a more uniform mass flow to rapidly enter each of the inlet ports 52 of the branch channel 55 and be jetted to an edge part of a wafer (W) through the jet ports 53.

In the exemplary embodiment of FIG. 8, the reaction gas is simultaneously discharged from the plurality of outlet holes 68 and uniformly enters the inlet ports 52. Therefore, although the number of channels of the branch channel 55 decreases compared to the exemplary embodiments of FIGS. 2 and 5, the exemplary embodiment of FIG. 8 may obtain the same effect.

Thus, even in case that large size wafer (W) is etched, the present invention can improve an etching uniformity of a center part and edge part of the large size wafer (W) by radially jetting a reaction gas of a uniform amount into a chamber 100 via a distribution channel part 50 of a distribution plate 10, 30, or 70. Also, the present invention can effectively cut off a decrease of an etch rate or a decrease of an etching width (CD) in the edge part by independently controlling a gas density at the edge part of the wafer (W), thus being capable of decreasing a process failure and remarkably improving a chip throughput of the edge part.

The above exemplary embodiments are merely described just for the sake of description convenience and are not intended to limit the claims, and are all applicable to other plasma vacuum processing devices such as a sputter or a chemical vapor deposition (CVD) device.

As described above, the present invention has an effect of, by compensating a difference of an etching speed between a center part and edge part of a wafer and removing an etch stop phenomenon in the edge part to improve etching uniformity, being capable of minimizing a process failure. Also, the present invention has an effect of, by making it possible to independently control a reaction gas jetted to the edge part separately from the center part, being capable of improving a chip throughput of the edge part and improving a productivity of a wafer through a reduction of process time and an improvement of process efficiency.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A side gas injector for a plasma reaction chamber, comprising:
   a circular distribution plate comprising an injection hole for injecting a reaction gas and a distribution channel part for distributing the reaction gas such that the reaction gas introduced from the injection hole can be radially simultaneously jetted in a plurality of positions along an inner circumference surface of the distribution plate; and
   a cover plate coupled to a top of the distribution plate and sealing a top of the distribution channel part;
   wherein the distribution channel part comprises:
   inlet ports which the reaction gas enters;
   a plurality of jet ports arranged at equal intervals along the inner circumference surface of the distribution plate; and
   a branch channel having flow paths sequentially branched such that the reaction gas introduced into the inlet port is uniformly distributed to each of the plurality of jet ports,
   wherein a plurality of the inlet ports are spaced apart and arranged along an outer circumference of the branch channel, wherein a circular diffusion channel communicating with the injection hole is provided in an outer circumference of the branch channel such that the reaction gas is uniformly distributed to the plurality of inlet ports, wherein, in the diffusion channel, a diffusion prevention jaw is provided such that a circular first diffusion path communicating with the injection hole and a second diffusion path are isolated and formed, and wherein an inlet hole and an outlet hole communicating with each other are provided in bottom surfaces of the first and second diffusion paths, respectively.

2. The side gas injector of claim 1, wherein, in the branch channel, the flow paths form a plurality of circular patterns forming a concentric circle on the basis of the center of the distribution plate, and a plurality of communication paths are spaced apart and installed such that the flow paths communicate with each other.

3. The side gas injector of claim 2, wherein the branch channel is comprised of a plurality of circular arc shaped channel segments, and wherein the channel segments are radially spaced a predetermined distance apart and arranged in the circumference direction and the radial direction such that the flow paths and the communication paths are formed.

4. The side gas injector of claim 3, wherein the channel segments form the communication paths such that the reaction gas is movable in zigzags.

5. The side gas injector of claim 1, wherein the diffusion channel is provided in a relatively larger width than the flow paths of the branch channel.

6. The side gas injector of claim 1, wherein the inlet hole and the outlet hole face each other with interposing the diffusion prevention jaw therebetween.

7. The side gas injector of claim 6, wherein the inlet hole and the outlet hole communicate with each other through a connection path through-formed below the diffusion prevention jaw, and wherein the connection path is connection formed such that slanting paths symmetrically face each other.

8. The side gas injector of claim 7, wherein a plurality of the inlet holes and outlet holes are arranged at equal intervals along the first and second diffusion paths, respectively.

9. The side gas injector of any one of claim 1, wherein the injection hole is provided in plural.

\* \* \* \* \*